(12) United States Patent
Bokor et al.

(10) Patent No.: US 7,821,196 B2
(45) Date of Patent: Oct. 26, 2010

(54) ILLUMINATION DEVICE WITH AT LEAST ONE LED AS THE LIGHT SOURCE

(75) Inventors: Dieter Bokor, Taufkirchen (DE); Andries Ellens, Den Haag (NL); Günter Huber, Schrobenhausen (DE); Frank Jermann, München (DE); Manfred Kobusch, Munich (DE); Michael Ostertag, Munich (DE); Wolfgang Rossner, Holzkirchen (DE); Franz Zwaschka, Ismaning (DE)

(73) Assignees: OSRAM Gesellschaft mit beschränkter Haftung, Munich (DE); OSRAM Opto Semiconductors GmbH, Regensburg (DE)

( * ) Notice: Subject to any disclaimer, the term of this patent is extended or adjusted under 35 U.S.C. 154(b) by 253 days.

(21) Appl. No.: 11/725,815

(22) Filed: Mar. 20, 2007

(65) Prior Publication Data
US 2007/0170842 A1 Jul. 26, 2007

Related U.S. Application Data

(60) Division of application No. 11/259,776, filed on Oct. 27, 2005, now Pat. No. 7,239,082, which is a continuation of application No. 10/311,722, filed as application No. PCT/DE01/02849 on Jul. 27, 2001, now Pat. No. 7,064,480.

(30) Foreign Application Priority Data
Jul. 28, 2000 (DE) ................................ 100 36 940

(51) Int. Cl.
*H01L 33/00* (2010.01)
*H01J 1/62* (2006.01)
(52) U.S. Cl. ...................... 313/503; 313/486; 313/499; 313/512; 257/99; 252/301.4 R; 252/301.6 P

(58) Field of Classification Search ....................... None
See application file for complete search history.

(56) References Cited

U.S. PATENT DOCUMENTS 3,505,240 A 4/1970 Barry
3,544,481 A 12/1970 Barry (Continued)

FOREIGN PATENT DOCUMENTS

EP 0 933 823 A2 8/1999
GB 1208594 10/1970

(Continued)

OTHER PUBLICATIONS

Sato, et al., "Full-Color Fluorescent Display Devices Using a Near-UV Light-Emitting Diode", *Jpn. J. Appl. Phys*, vol. 35 (1996) pp. L 838-L 839, XP -000733074.

(Continued)

*Primary Examiner*—Sikha Roy
(74) *Attorney, Agent, or Firm*—Holtz, Holtz, Goodman & Chick, P.C.

(57) ABSTRACT

An illumination device with at least one LED as the light source, the LED emitting primary radiation in the range from 370 to 430 nm of the optical spectral region (peak wavelength), this radiation being partially or completely converted into radiation of a longer wavelength by three phosphors which are exposed to the primary radiation from the LED and which emit in the blue, green and red spectral regions, so that white light is formed. The conversion is achieved at least with the aid of a phosphor which emits blue light with a wavelength maximum at 440 to 485 nm, and with the aid of a phosphor which emits green light with a wavelength maximum at 505 to 550 nm, and with the aid of a phosphor which emits red light with a wavelength maximum at 560 to 670 nm.

10 Claims, 16 Drawing Sheets

U.S. PATENT DOCUMENTS

| | | | |
|---|---|---|---|
| 4,859,902 A | 8/1989 | De Leeuw et al. | |
| 5,604,763 A | 2/1997 | Kato et al. | |
| 5,640,792 A | 6/1997 | Smith et al. | |
| 5,813,753 A | 9/1998 | Vriens et al. | |
| 5,851,063 A | 12/1998 | Doughty et al. | |
| 5,885,752 A | 3/1999 | Itou et al. | |
| 5,998,925 A | 12/1999 | Shimizu et al. | |
| 6,051,925 A | 4/2000 | Boerner et al. | |
| 6,084,250 A | 7/2000 | Justel et al. | |
| 6,096,243 A * | 8/2000 | Oshio et al. | 252/301.4 R |
| 6,099,754 A | 8/2000 | Yocom | |
| 6,234,648 B1 | 5/2001 | Borner et al. | |
| 6,255,670 B1 | 7/2001 | Srivastava et al. | |
| 6,294,800 B1 | 9/2001 | Duggal et al. | |
| 6,299,338 B1 | 10/2001 | Levinson et al. | |
| 6,392,248 B1 | 5/2002 | Takahara et al. | |
| 6,429,583 B1 | 8/2002 | Levinson et al. | |
| 6,576,156 B1 * | 6/2003 | Ratna et al. | 252/301.4 R |
| 6,603,146 B1 | 8/2003 | Hata et al. | |
| 6,614,172 B2 | 9/2003 | Chiu et al. | |
| 6,621,211 B1 | 9/2003 | Srivastava et al. | |
| 6,628,249 B1 | 9/2003 | Kamikawa et al. | |
| 6,666,738 B1 * | 12/2003 | Kado et al. | 445/6 |
| 6,791,259 B1 | 9/2004 | Stokes et al. | |
| 6,982,045 B2 * | 1/2006 | Menkara et al. | 252/301.4 F |
| 7,227,190 B2 * | 6/2007 | Yasukawa et al. | 257/79 |
| 7,268,492 B2 * | 9/2007 | Tanaka et al. | 313/582 |
| 7,391,060 B2 * | 6/2008 | Oshio | 257/98 |
| 2001/0015443 A1 | 8/2001 | Komoto et al. | |
| 2002/0063301 A1 | 5/2002 | Hanamoto et al. | |

FOREIGN PATENT DOCUMENTS

| | | |
|---|---|---|
| WO | WO 97/48138 | 12/1997 |
| WO | WO 98/12757 | 3/1998 |
| WO | WO 98-39805 | 9/1998 |
| WO | WO 98/39807 | 9/1998 |
| WO | WO 00/19546 A1 | 4/2000 |
| WO | WO 00/32982 | 6/2000 |
| WO | WO 00/32982 A1 | 6/2000 |
| WO | WO 00/33389 | 6/2000 |
| WO | WO 00/33389 A1 | 6/2000 |
| WO | WO 00/33390 | 6/2000 |

OTHER PUBLICATIONS

Poort et al, "Optical Properties of $Eu^{2+}$-activated orthosilicates and orthophosphates," Journal of Alloys and Compounds 260 (1997) 93-97.

* cited by examiner

ILLUMINATION DEVICE WITH AT LEAST ONE LED AS THE LIGHT SOURCE

This application is a divisional application of application Ser. No. 11/259,776 filed Oct. 27, 2005 U.S. Pat. No. 7,239,082, which is a continuation application of application Ser. No. 10/311,722 filed Dec. 19, 2002 (U.S. Pat. No. 7,064,480), which is the United States national phase application of International Application PCT/DE01/02849, filed Jul. 27, 2001 which is hereby incorporated in its entirety herein by this reference.

TECHNICAL FIELD

The invention is based on an illumination device with at least one LED as the light source in accordance with the preamble of claim 1. This is in particular a luminescence conversion LED which emits in the visible or white region and is based on an LED which edits primarily in the near UV or blue at short wavelengths.

PRIOR ART

LEDs which emit white light are currently produced predominantly by the combination of a Ga(In) N-LED which emits in the blue at approximately 460 nm and a YAG:$Ce^{3+}$ phosphor which emits yellow light (U.S. Pat. No. 5,998,925 and EP 862 794). However, the-use of these white-light LEDs for general illumination is limited, on account of their poor color rendering resulting from the absence of color components (primarily the red component). Instead, it is also attempted to combine LEDs which emit primarily in the blue region with a plurality of phosphors, in order to improve the color rendering, cf. WO 00/33389 and WO 00/33390.

Moreover, in principle it is known to produce white-emitting LEDs using what are known as organic LEDs or by connecting together monochrome LEDs with a suitable color mixture. A UV LED (emission maximum between 300 and 370 nm) is generally used, converted into white light by means of a plurality of phosphors, generally three, which emit in the red, green and blue spectral regions (RGB mixture) (WO 98 39 805, WO 98 39 807 and WO 97 48 138). As the blue component, $BaMgAl_{10}O_{17}$:$Eu^{2+}$ or ZnS:$Ag^+$ are known as inorganic phosphors; ZnS:$Cu^+$ or (Zn, Cd)S:$Cu^+$, or ZnS:(Al, Cu)$^+$ are known as blue-green component; $Y_2O_2S$: $Eu^{2+}$ is known as red component. Moreover, a range of organic phosphors is recommended.

Fluorescent lamps and incandescent lamps are less suitable for white-emitting sources with a high light quality and small dimensions or as background illumination for LCDs for example. Although OLEDs are more suitable, the ability of organic phosphors to withstand UV is worse than that of inorganic phosphors. Moreover, the production costs are higher. Blue LEDs using the phosphor YAG:$Ce^{3+}$ (and garnets derived therefrom) are in principle also suitable, but there are drawbacks with regard to adjustment of the color locus: the color locus can only to a restricted extent be selected in such a manner that white light allowing good color rendering is formed, since the white color impression is formed primarily through the mixture of blue emission from the LED and yellow emission from the phosphor. The drawback of fluorescent lamps and UV-(O)LEDs is that UV energy is converted into visible light with a poor energy efficiency: UV radiation (in fluorescent lamps 254 and 365 nm; in UV LEDs 300-370 nm) with a wavelength of, for example, 254 nm is converted into light with a wavelength of 450-650 nm. This means an energy loss of 40 to 60% for a theoretical quantum efficiency of 100%.

Organic phosphors are generally more difficult to produce than inorganic phosphors, and furthermore are generally too unstable to be used in light sources with a long service life (e.g. over 30 000 hours).

This prior art has a number of significant drawbacks with regard to the energy efficiency of the combination of LED and phosphors and/or the stability of the-phosphors and/or limitations with regard to geometric dimensions.

SUMMARY OF THE INVENTION

It is an object of the present invention to provide an illumination device with at least one LED as light source in accordance with the preamble of claim 1 which is distinguished by a high efficiency.

These objects are achieved by the characterizing features of claim 1. Particularly advantageous configurations are given in the dependent claims.

The invention is particularly advantageous in connection with the development of an LED which emits in the visible or white region. This LED can be produced by combining an LED which emits in the near UV or very short-wavelength blue light (referred to below as "short-wave" for short) with an emission wavelength of between 370 and 430 nm and at least one of the phosphors listed below which completely or partially absorbs the radiation from the LED and emits it even in spectral regions in which additive mixing with the light from the LED and/or other coloring materials results in white light with good color rendering or light with a desired color locus. Depending on the application, a single phosphor having the properties of the invention may be sufficient. If appropriate, it may also be combined with one or more further phosphors according to the invention or phosphors belonging to other classes, for example of the YAG:Ce type. The blue light from the LED cannot (or can scarcely) be utilized directly, unlike in the prior art, which uses longer-wave blue (430 to 480 nm), but rather is only suitable for primary excitation of the phosphors.

A primary radiation source, the emission from which is much closer to the wavelength at which the phosphors emit, can considerably increase the energy efficiency. By way of example, in the case of a source which emits at 400 nm, the energy loss is already reduced to only 12 to 39%.

The technical problem lies in the development and production of sufficiently efficient phosphors which can be excited in the spectral range between 370 nm and 430 nm and at the same time have suitable emission characteristics.

To produce a colored or white LED, a phosphor according to the invention, if appropriate in conjunction with one or more further phosphors, is combined with a binder which is as transparent as possible (EP 862 794). The phosphor completely or partially absorbs the light from the LED which emits UV/blue light and emits it again in broadband form in other spectral regions, so that an overall emission with a desired color locus is formed. Hitherto, there have scarcely been phosphors which satisfy these requirements as well as the phosphors described here. They have a high quantum efficiency (typically 70%) and, at the same time, a spectral emission which is perceived as bright on account of the sensitivity of the eye. The color locus can be set within a wide range. Further advantages of these phosphors are that they are relatively easy and environmentally friendly to produce, are nontoxic and are relatively highly chemically stable.

The invention relates in particular to an illumination device with at least one LED as light source (light emitting diode), which generates in particular, specifically desired hues (for example magenta) or which, for example, generates white light as a result of radiation which is emitted primarily at short wavelengths (i.e. UV to blue in the range from 370 to 430 nm) being converted into white by means of a plurality of phosphors: either by mixing the secondary radiation from a blue- and yellow-emitting phosphor or in particular by RGB mixing from three phosphors which emit red, green and blue. If there are particularly high demands imposed on the color rendering, it is also possible for more than three phosphors to be combined. For this purpose, it is also possible for one of the phosphors used in accordance with the invention to be combined with other phosphors which are already known for this use, such as for example SrS:Eu (WO 00/33390) or YAG:Ce (U.S. Pat. No. 5,998,925).

A Ga(In, Al) N LED is particularly suitable as an LED which emits primarily at short wavelengths, but any other way of producing a short-wave LED with a primary emission in the range from 370 to 430 nm is also suitable.

The invention widens the spectral emission characteristic of the LEDs, in that further phosphors, which go above and beyond current knowledge, and mixtures thereof are used (cf. Tables 1 to 3). The choice of phosphors and mixtures thereof which are used may be such that in addition to true white, other mixed colors with broadband emission are also produced. In general, the light emitted by the LED is absorbed by the mixture which contains phosphors. This mixture is either applied directly to the LED or is dispersed in a resin or silicone or applied to a transparent plate above an LED or applied to a transparent plate above a plurality of LEDs.

The inventive step consists in the fact that, by using LEDs with emission wavelengths between 370 and 430 nm (invisible or scarcely visible deep blue) and using phosphors which are listed below, it is possible to achieve improved spectral matching of the LED emission and to set any desired color loci, specifically with a higher energy efficiency than with conventional LEDs.

Inorganic phosphors, which can be excited at relatively long wavelengths, are currently scarcely known. Surprisingly, however, it has been found that there a number of inorganic phosphors which are still able to be efficiently excited using radiation with a peak emission wavelength of 370-430 nm. Half-intensity widths of the emission typically lie at 20 nm to 50 nm. The absorption of the phosphors can be controlled by the selected structure parameters and chemical composition. Such phosphors all have a relatively small band gap (typically approximately 3 eV) or have a strong crystal field for the ion which absorbs the UV/blue light emitted by the LED around 400 nm.

Specific combinations of phosphors in the phosphor mixture can be selected according to the selected luminescence wavelength of the LED (370-430 nm) and depending on the desired color rendering and/or the desired color locus. The most suitable phosphor mixture is therefore dependent on the selected objective (color rendering, color locus, color temperature) and the LED emission wavelength which is present.

Any phosphor which satisfies the conditions mentioned above is in principle suitable for application. Phosphors which emit efficiently and can be excited efficiently or at least partially excited in the range from 370-430 nm are listed in the tables below. Table 1 describes suitable blue phosphors with a peak emission wavelength of 440 to 485 nm, Table 2 describes suitable green phosphors with a peak emission wavelength from 505 to 550 nm, and Table 3 describes suitable red phosphors with a peak emission wavelength from 560 to 670 nm. In this way, it is for the first time possible to produce high-efficiency LEDs which are based on a diode which emits at short wavelengths and excites a plurality of phosphors.

TABLE 1

| Blue-emitting phosphors: | |
|---|---|
| $M_5(PO_4)_3(X):Eu^{2+}$ | where M = at least one of the metals Ba, Ca alone or in combination with Sr (the Sr content is preferably at most 85%), and where X = at least one of the halogens F or Cl; |
| $M^*_3MgSi_2O_8:Eu^{2+}$ | where M* = at least one of the metals Ba, Ca, Sr alone or in combination |
| $Ba_5SiO_4Br_6:Eu^{2+}$ | |
| $Ba_{1.29}Al_{12}O_{19.29}:Eu^{2+}$ | |
| $YSiO_2N:Ce^{3+}$ | |
| $(Sr, Ba)_2Al_6O_{11}:Eu^{2+}$ | |
| $MF_2:Eu^{2+}$ | where M = at least one of the metals Ba, Sr, Ca; the proportion of M formed by Ba is preferably >5%, for example Ba = 10%, i.e. M = $Ba_{0.10}Sr_{0.45}Ca_{0.45}$. |
| $Ba_{0.57}Eu_{0.09}Al_{11.11}O_{17}:Eu^{2+}$ | |
| $M^{}MgAl_{10}O_{17}:Eu^{2+}$ | where M = at least one of the metals Eu, Sr alone or in combination with Ba (the Ba content is preferably at most 75%); |
| $MLn_2S_4:Ce^{3+}$ | where M = a combination of the metals Ca, Sr; and Ln = at least one of the metals La, Y, Gd. |

TABLE 2

| Green (and blue-green) emitting phosphors | |
|---|---|
| $SrAl_2O_4:Eu^{2+}$ | |
| $MBO_3:(Ce^{3+}, Tb^{3+})$ | where M = at least one of the metals Sc, Gd, Lu alone or in combination with Y (Y content in particular <40%); and the metals Ce and Tb together function as activator; in particular, the proportion of Ce in relation to the metal M is in the range from 5% ≦ Ce ≦ 20% and the proportion of Tb in relation to the metal is in the range 4% ≦ Tb ≦ 20%; the proportion of Ce is preferably > the proportion of Tb; |
| $M_2SiO_5:(Ce^{3+}, Tb^{3+})$ | where M = at least one of the metals Y, Gd, Lu; and the metals Ce and Tb together function as activator (the proportion of Ce is preferably > the proportion of Tb); |
| $MN^*_2S_4:Ak$ | where M = at least one of the metals Zn, Mg, Ca, Sr, Ba; where N* = at least one of the metals Al, Ga, In; and Ak = either a combination of $Eu^{2+}$, $Mn^{2+}$ together (the proportion of Eu is preferably > the proportion of Mn) or a combination of $Ce^{3+}$, $Tb^{3+}$ together (the proportion of Ce is preferably > the proportion of Tb); |
| $SrBaSiO_4:Eu^{2+}$ | |
| $Ba_{0.82}Al_{12}O_{18.82}:Eu^{2+}$ | |
| $Ba_{0.82}Al_{12}O_{18.82}:Eu^{2+}, Mn^{2+}$ | |
| $Y_5(SiO_4)_3N:Ce^{3+}$; | |
| $Ca_8Mg(SiO_4)_4Cl_2:Ak$ | where Ak = $Eu^{2+}$ alone or together with $Mn^{2+}$ (the proportion of Eu is preferably > twice the proportion of Mn); |
| $Sr_4Al_{14}O_{25}:Eu^{2+}$ | |
| $(Ba, Sr)MgAl_{10}O_{17}:Ak$ | where Ak = $Eu^{2+}$ either in combination with $Ce^{3+}$ and $Tb^{3+}$, or in combination with $Mn^{2+}$; the proportion of Eu in the activator Ak is preferably >50%; |
| $Sr_6BP_5O_{20}:Eu^{2+}$ | |
| $Sr_2P_2O_7:(Eu^{2+}, Tb^{3+})$ | with Eu and Tb together |
| $BaSi_2O_5:Eu^{2+}$ | |

TABLE 3

Red (orange-red to deep red) emitting phosphors

| | |
|---|---|
| $Ln_2O_2St:Ak^{3+}$ | where Ln = at least one of the metals Gd, La, Lu alone or in combination with Y (the proportion of Y is preferably at most 40%; in particular, the proportion of La is at least 10%); and where St = at least one of the elements S, Se, Te; and where Ak = Eu alone or in combination with Bi; |
| $Ln_2WmO_6:Ak^{3+}$ | where Ln = at least one of the metals Y, Gd, La, Lu; and where Wm = at least one of the elements W, Mo, Te; and where Ak = Eu alone or in combination with Bi; |
| $(Zn, Cd)S:Ag^+$ | where Zn and Cd are only used in combination; the proportion of Zn is preferably < the proportion of Cd; |
| $Mg_{28}Ge_{7.5}O_{38}F_{10}:Mn^{4+}$ | |
| $Sr_2P_2O_7:Eu^{2+}, Mn^{2+}$ | |
| $M_3MgSi_2O_8:Eu^{2+}, Mn^{2+}$ | where M = at least one of the metals Ca, Ba, Sr. |
| $(M1)_2(M2)(BO_3)_2:Eu^{2+}$ | where M1 = at least one of the metals Ba, Sr; and where M2 is at least one of the metals Mg, Ca; the proportion of Ba in the cation M1 is preferably at least 80%; the proportion of Mg in the metal M2 is preferably at least 70%. |

It should be noted that the activator generally in each case replaces a fraction of the earlier cation (=metal, in particular a lanthanide Ln), for example MS:Eu(5%) stands for $M_{1-0.05}Eu_{0.05}S$.

The wording "M=at least one of the metals X, Y;" means either the metal X or the metal Y alone or a combination of the two metals, i.e. $M=X_aY_b$ where a+b=1.

In the case of a white LED, a structure similar to that described in the prior art cited in the introduction is used. GaInN or GaN or GaInAlN is preferably used as the UV diode (primary radiation source). By way of example, it has a peak wavelength of 400 nm and a half-intensity width of 20 nm. The diode substrate is directly or indirectly coated with a suspension comprising three phosphors, one each with an emission maximum in the red, green and blue spectral regions. At least one of these phosphors-is selected from Tables 1 to 3 and combined either with known phosphors or with phosphors from the other tables. The phosphor mixture is fired at approximately 200° C. This results in a color rendering of typically 80.

In the text which follows, the invention is to be explained in more detail with reference to a plurality of exemplary embodiments. In the drawing:

FIG. 1 shows a semiconductor component which is used as light source (LED) for white light;

FIG. 2 shows an illumination device with phosphors in accordance with the present invention;

FIGS. 3 to 17 show the emission spectrum of LEDs with various phosphor mixtures in accordance with the present invention.

DESCRIPTION OF THE DRAWINGS

For use in a white LED together with a GaInN chip, by way of example a structure similar to that described in U.S. Pat. No. 5,998,925 is used. The structure of a light source of this type for white light is specifically illustrated in FIG. 1. The light source is a semiconductor component (chip 1) of the InGaN type, with a peak emission wavelength of 420 nm and a half-intensity width of 25 nm, having a first and second electrical connection 2, 3, which is embedded in an opaque base housing 8 in the region of a recess 9. One of the connections 3 is connected to the chip 1 via a bonding wire 14. The recess has a wall 17 which serves as reflector for the blue primary radiation of the chip 1. The recess 9 is filled with a potting compound 5 which as its main constituents contains an epoxy casting resin (80 to 90% by weight) and phosphor pigments 6 (less than 15% by weight). There are also further small amounts of, inter alia, methyl ether and Aerosil. The phosphor pigments are a mixture. The first conversion phosphor is selected from Table 1. The second phosphor is selected from Table 2, and the third phosphor is selected from Table 3.

A number of specific exemplary embodiments of phosphors tested in combination are compiled in Table 4. This represents a summary of suitable phosphors according to the invention and phosphors which are known per se in all three spectral regions. Column 1 indicates the test number, column 2 gives the chemical formula of the phosphor, column 3 gives the emission maximum of the phosphor, and columns 4 and 5 give the x and y color locus coordinates. Columns 6 and 7 give the reflectivity and the quantum efficiency (in each case in percent).

Figure 6:
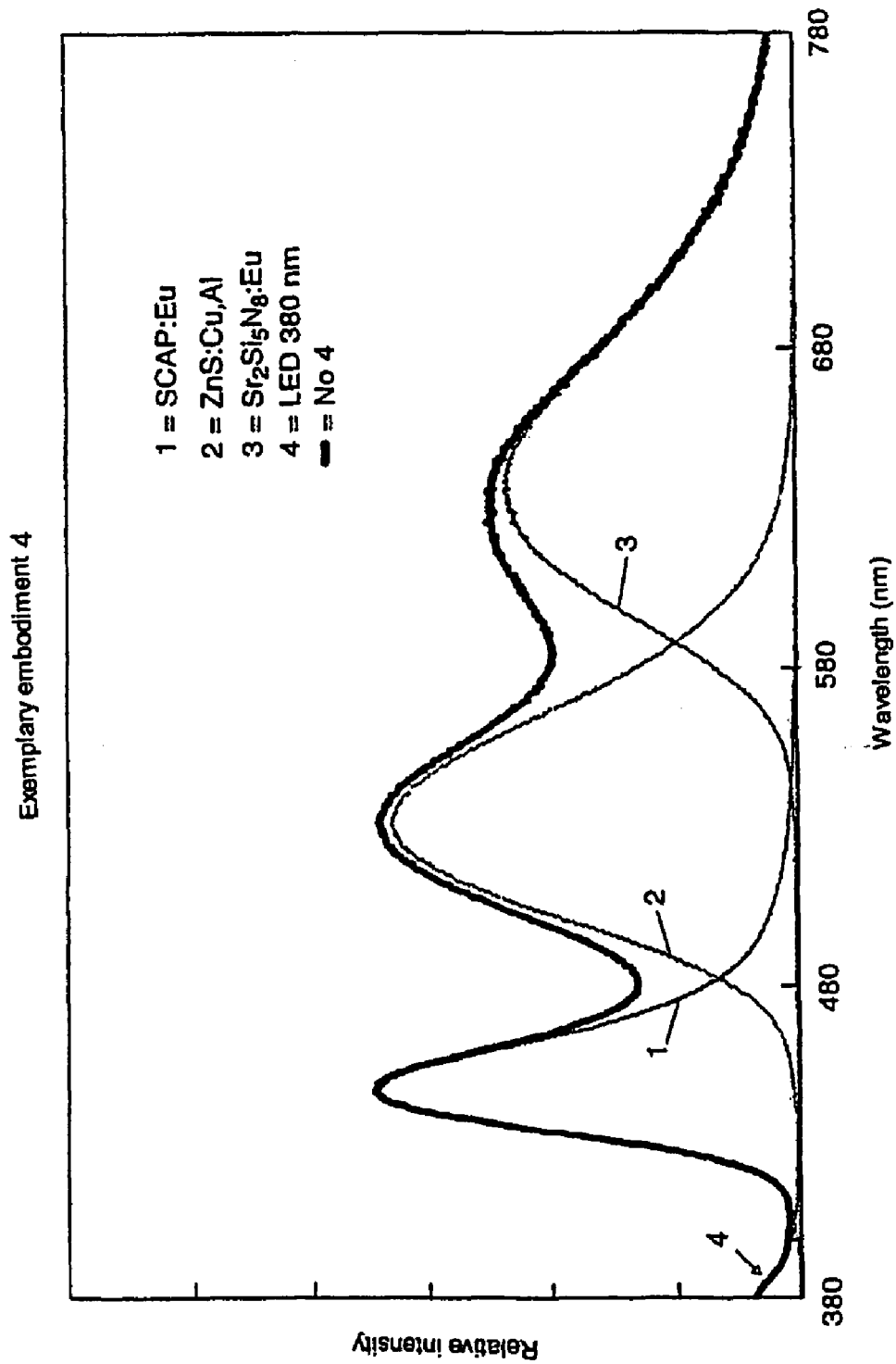
Figure 7:
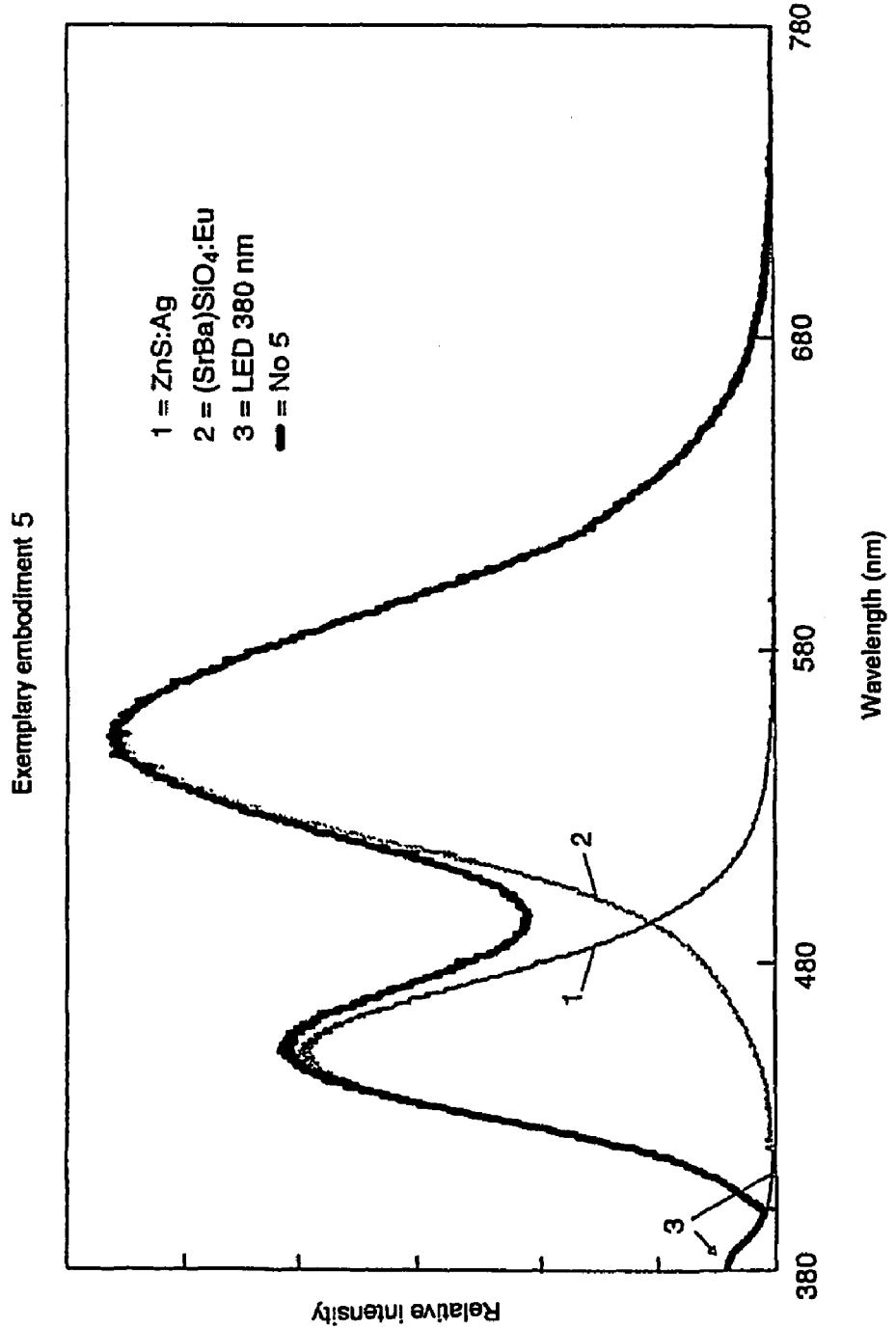
Figure 8:
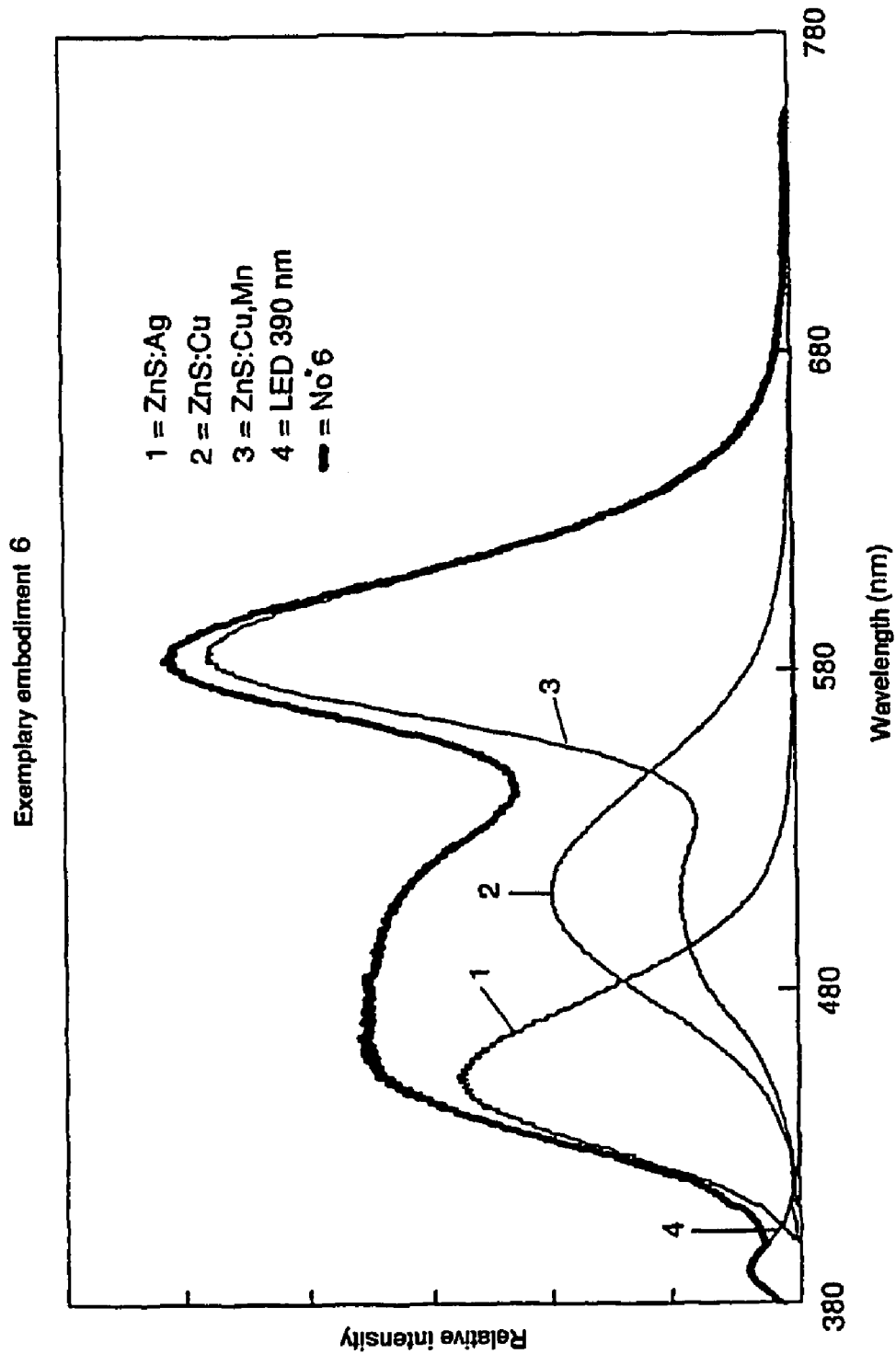
Figure 9:
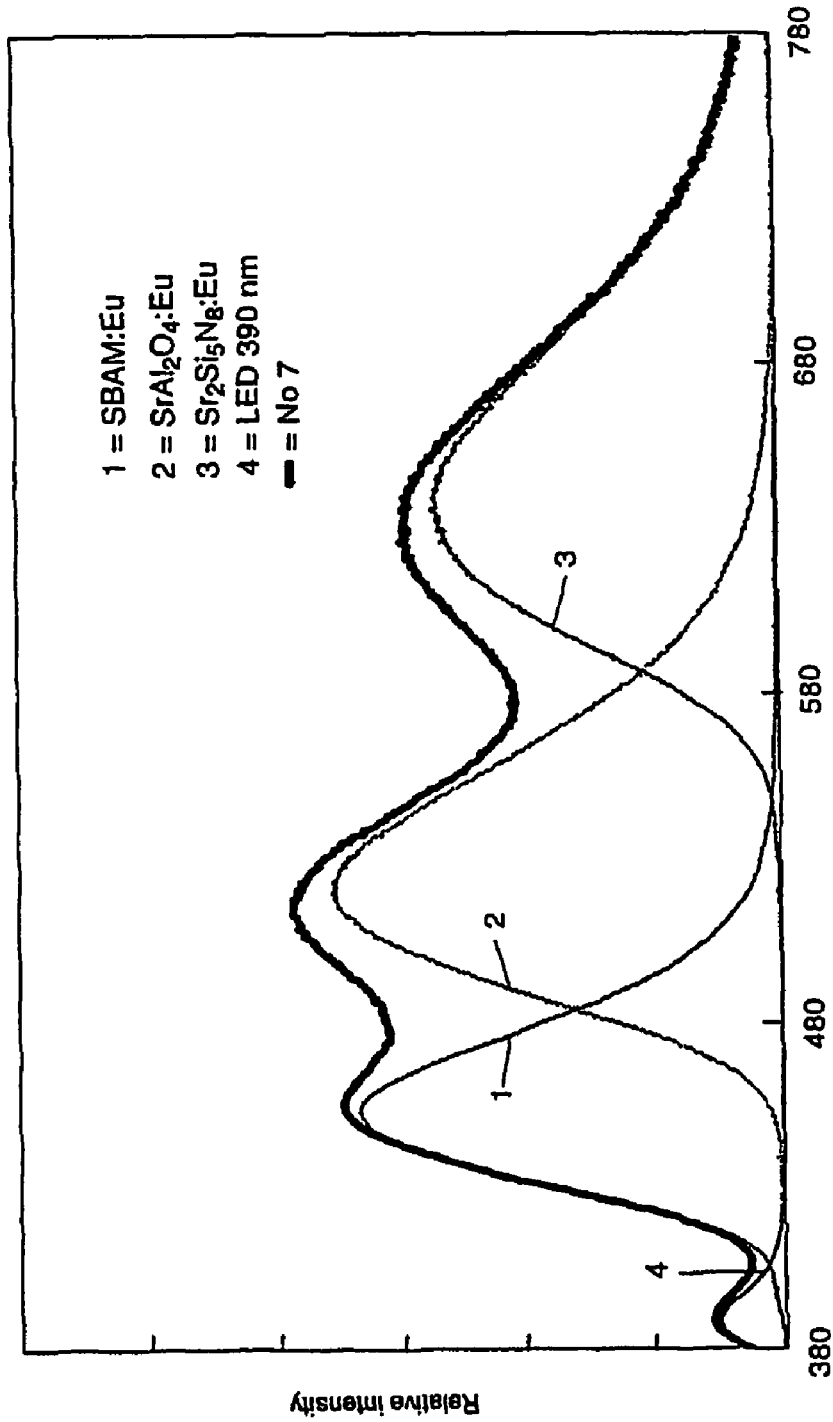
Figure 10:
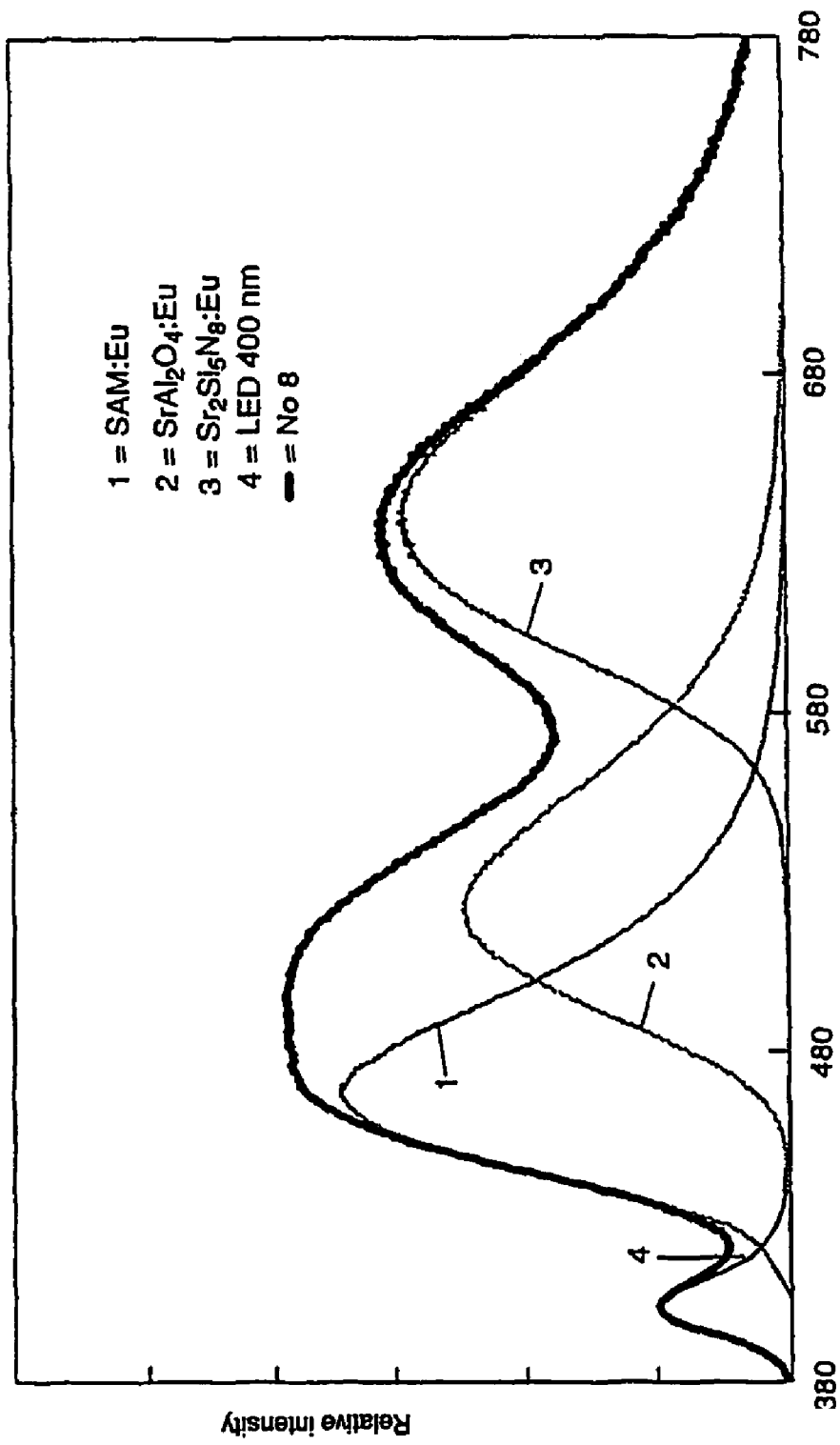
Figure 11:
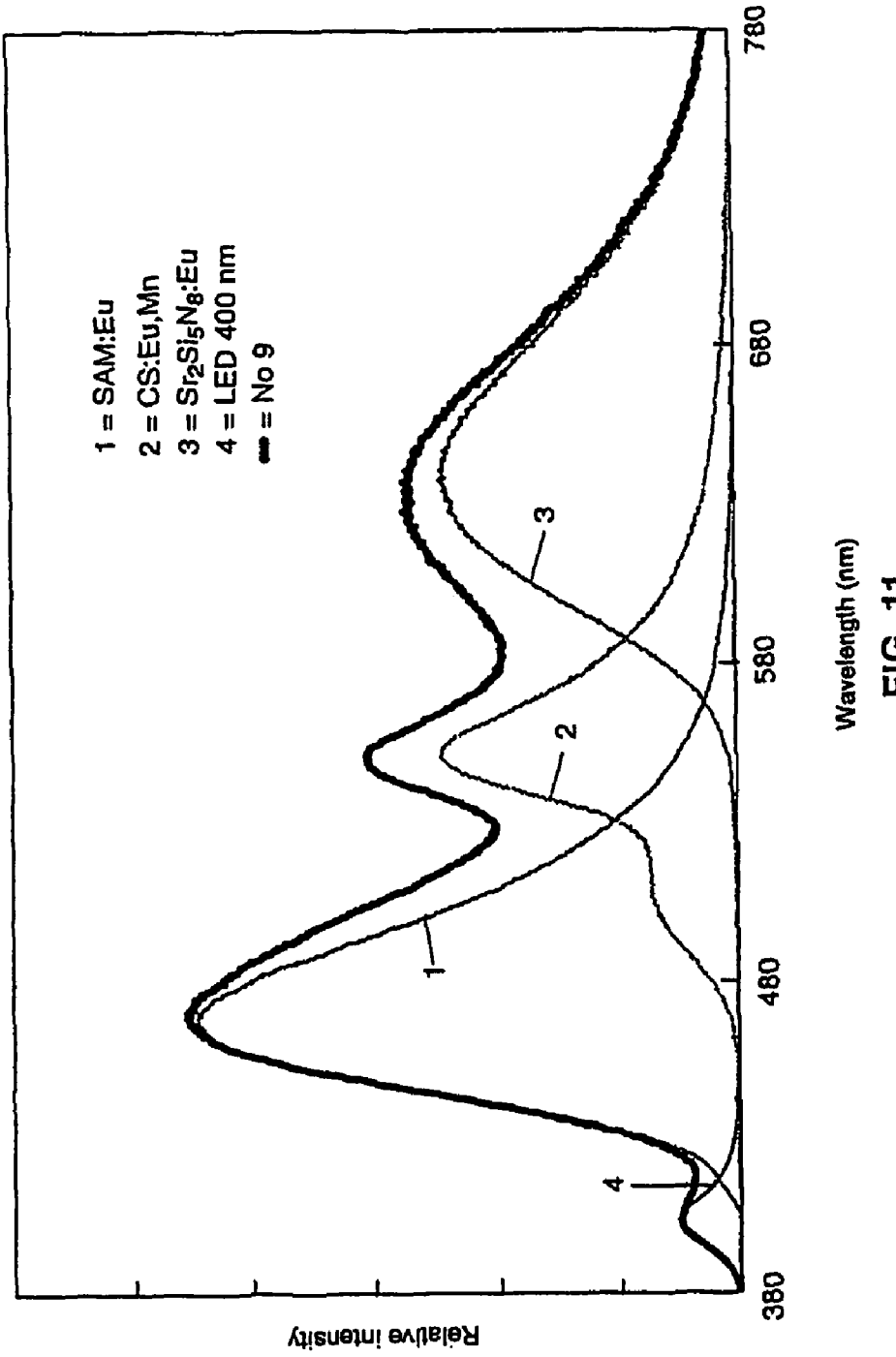
Figure 12:
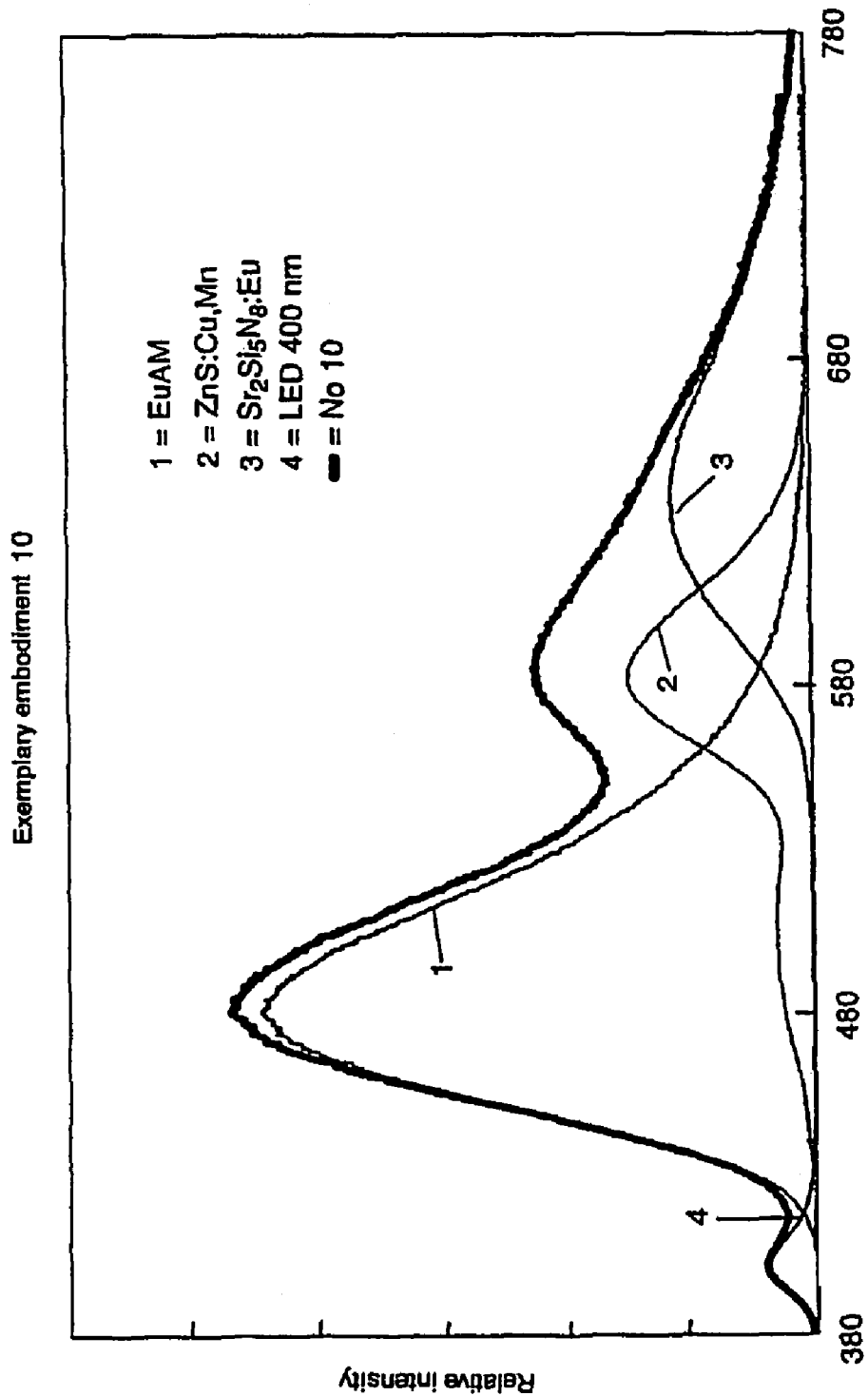
Figure 13:
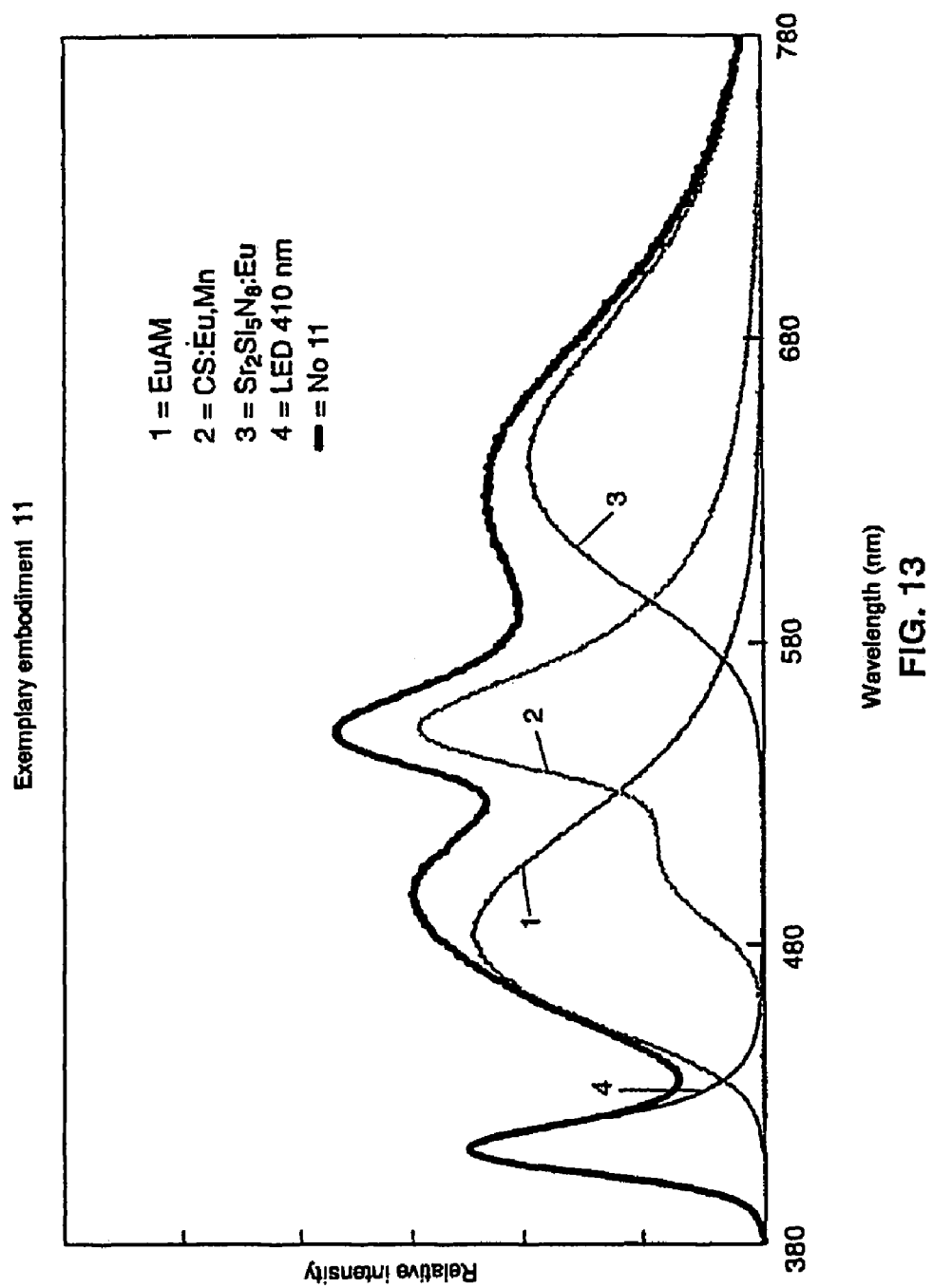
Figure 14:
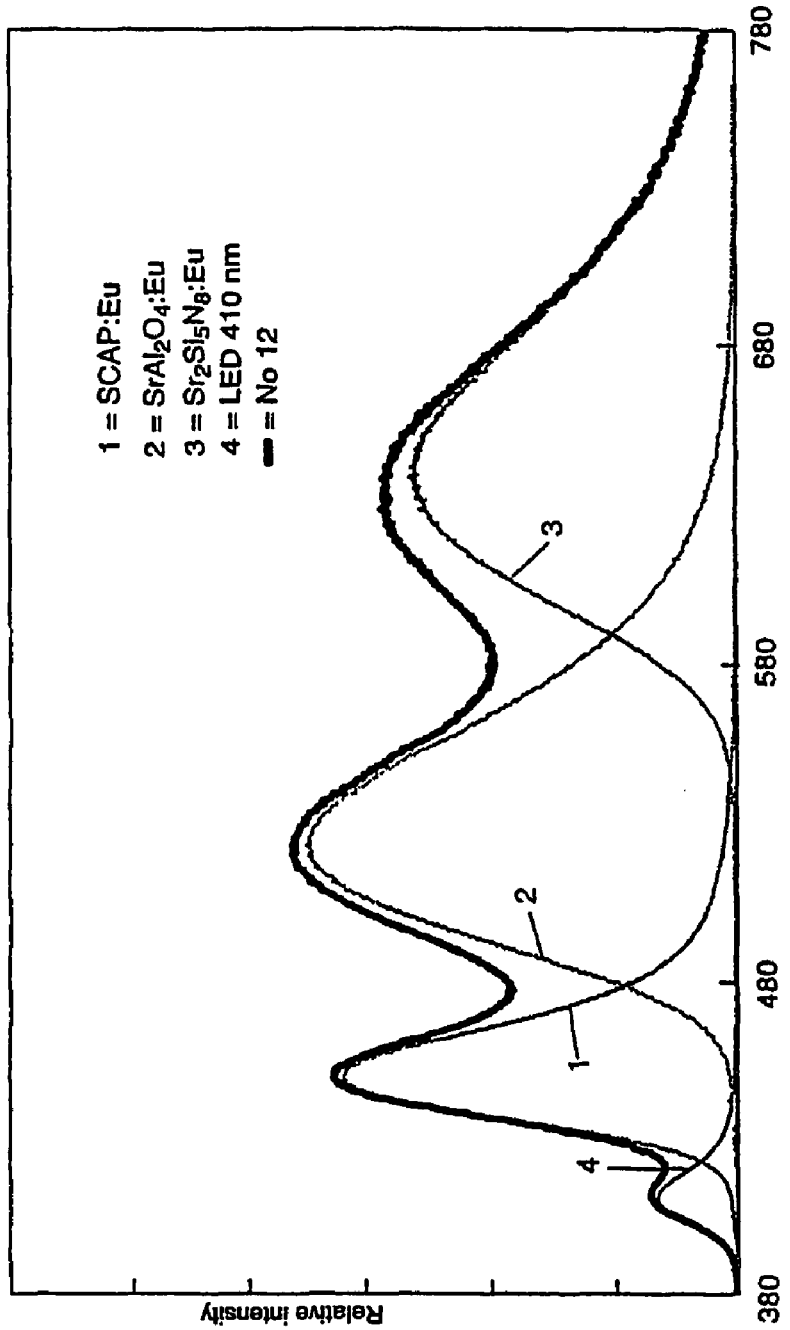
Figure 15:
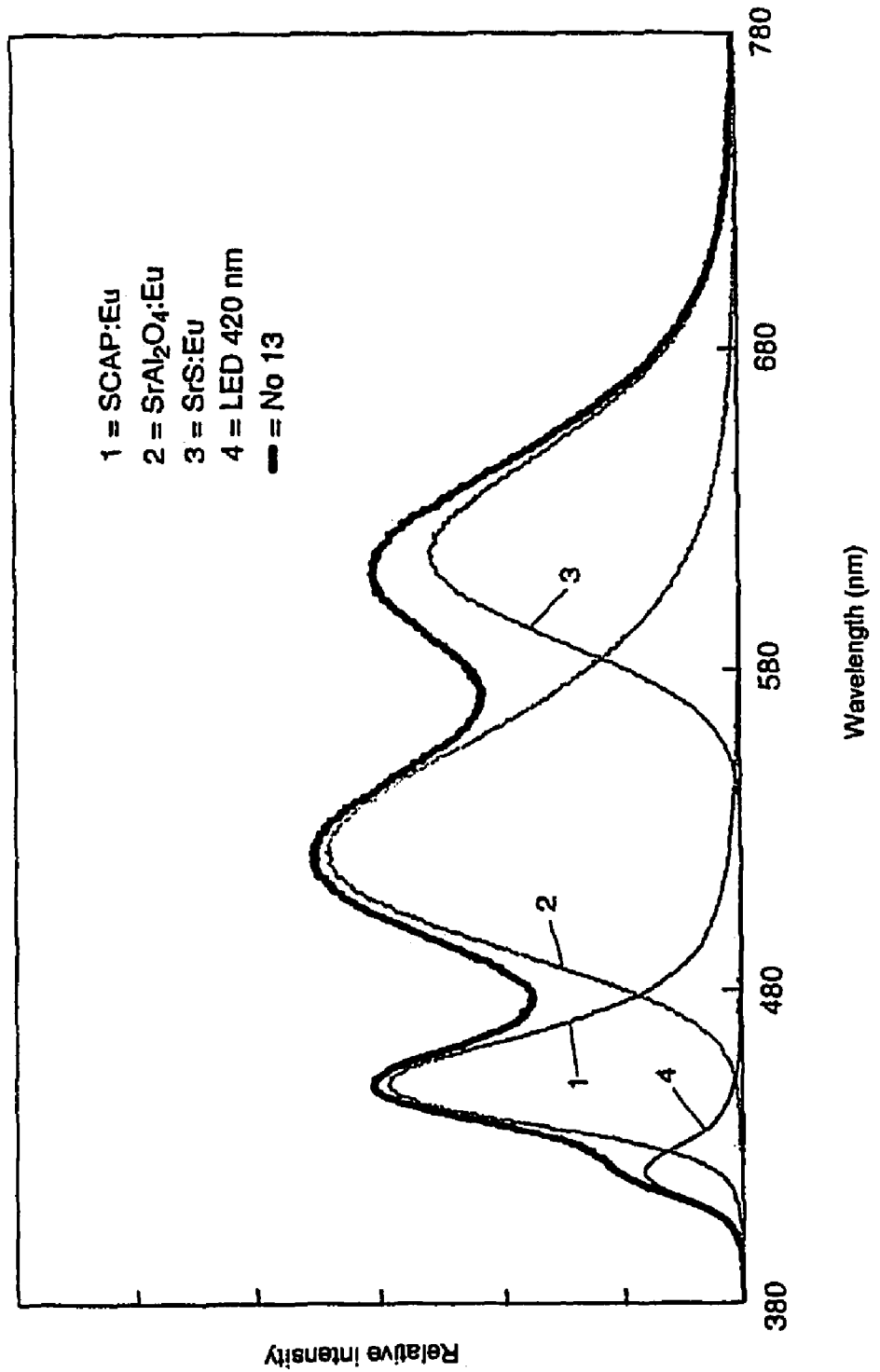
Figure 16:
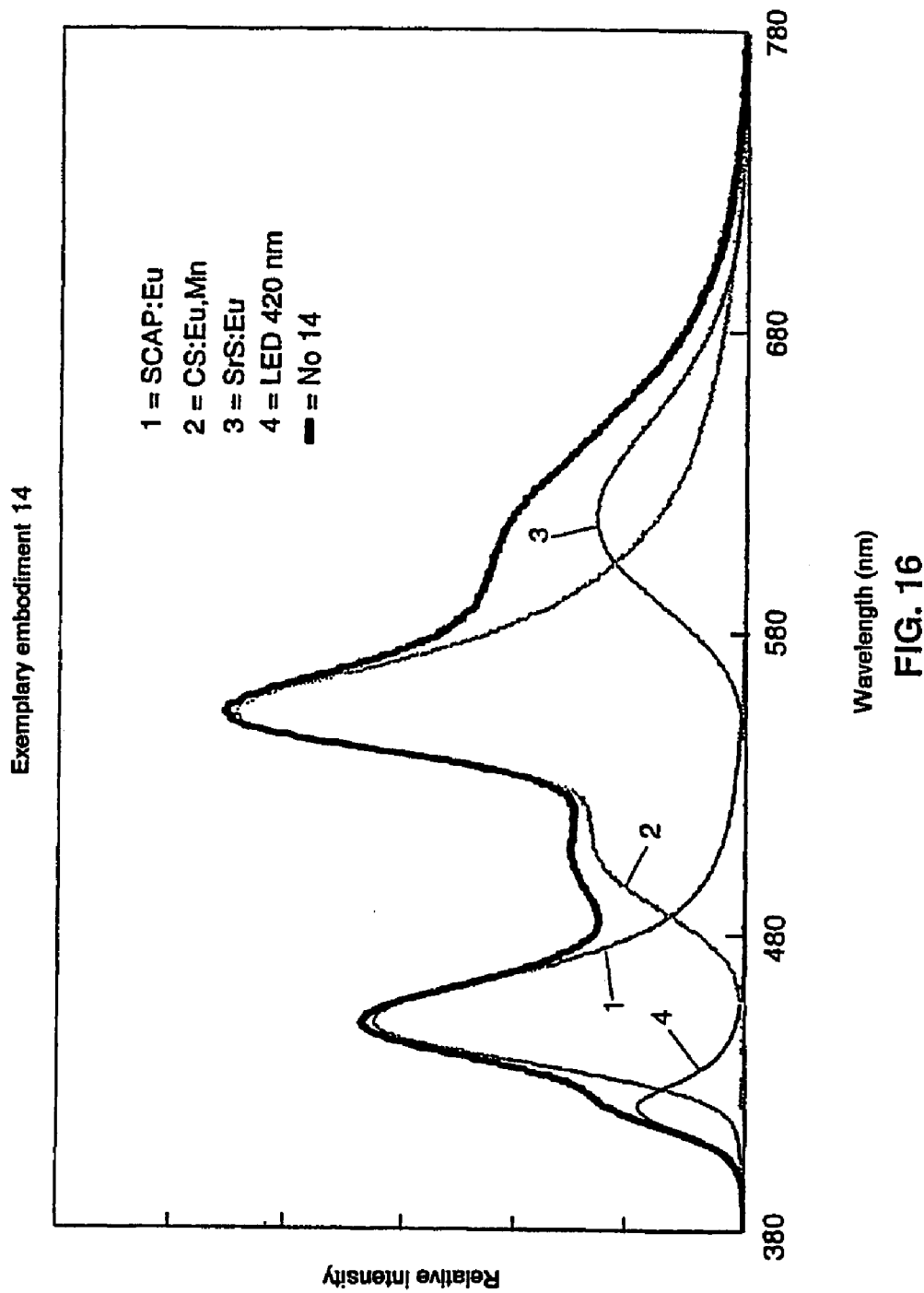
Figure 17:
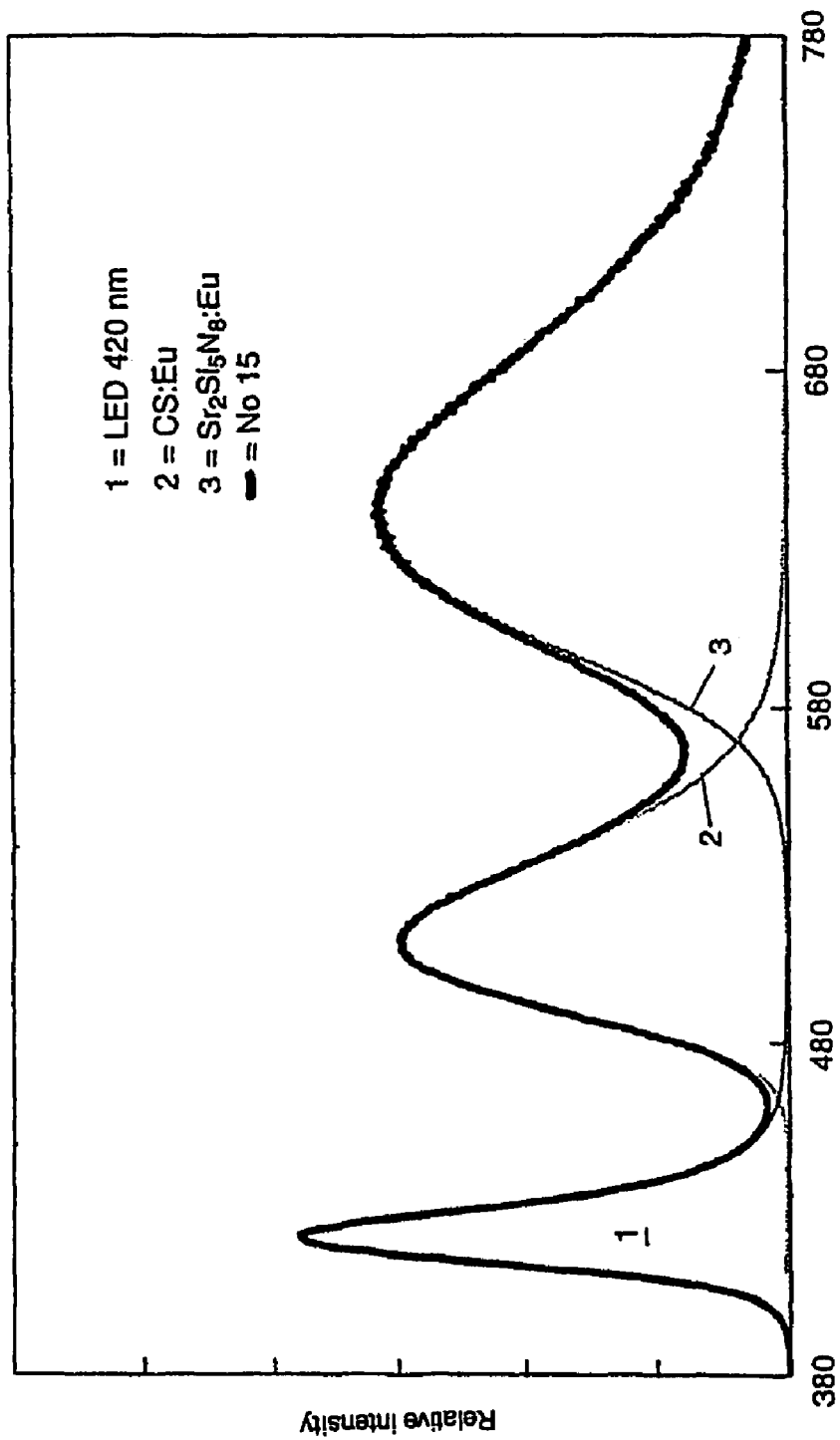

The use of the ZnS phosphors for LEDs is also particularly preferred. These phosphors are easy to process in the vicinity of LEDs. They are primarily the blue-emitting phosphor ZnS:Ag, the green-emitting phosphor ZnS:Cu, Al and the red-emitting phosphor ZnS:Cu, Mn from Table 4. In particular, it should be noted that with these three phosphors it is possible to produce a white-emitting phosphor mixture with excitation by an LED with primary radiation in the range from 370 to 410 nm, cf. exemplary embodiment 6 in FIG. 6. Since these three phosphors are chemically virtually identical materials, they can be processed highly successfully as a phosphor mixture in a casting resin or other resin or in a slurry.

TABLE 4

| No. | Formula | Em | x | y | R (%) | Q.E (%) |
|---|---|---|---|---|---|---|
| 1 | $Ba_3MgSi_2O_6:Eu$ (5%) | 440 | 0.16 | 0.07 | 42 | 50 |
| 2 | $(Ba_{0.15}Sr_{0.85})_5(PO_4)_3Cl:Eu2+$ | 448 | 0.15 | 0.05 | 46 | 76 |

TABLE 4-continued

| No. | Formula | Em | x | y | R (%) | Q.E (%) |
|---|---|---|---|---|---|---|
| 3 | ZnS:Ag | 452 | 0.14 | 0.07 | 76 | 63 |
| 4 | (Ba, Sr)MgAl$_{10}$O$_{17}$:Eu2+ | 454 | 0.15 | 0.08 | 49 | 83 |
| 5 | SrMgAl$_{10}$O$_{17}$:Eu2+ | 467 | 0.15 | 0.19 | 63 | 92 |
| 6 | EuMgAl$_{10}$O$_{17}$ | 481 | 0.17 | 0.31 | 35 | 63 |
| 7 | ZnS:Cu | 506 | 0.19 | 0.43 | 22 | 48 |
| 8 | Ba$_{0.74}$Eu$_{0.08}$Al$_{12}$O$_{18.82}$ | 507 | 0.22 | 0.43 | 52 | 87 |
| 9 | Ca$_8$Mg(SiO$_4$)$_4$Cl$_2$:Eu2+ | 508 | 0.17 | 0.6 | 34 | 67 |
| 10 | ZnS:Cu | 510 | 0.2 | 0.46 | 16 | 55 |
| 11 | BaMgAl$_{10}$O$_{17}$:Eu2+, Mn2+ | 513 | 0.14 | 0.21 | 64 | 95 |
| 12 | Ba$_{0.72}$Eu$_{0.05}$Mn$_{0.05}$Al$_{12}$O$_{18.82}$ | 514 | 0.21 | 0.48 | 71 | 97 |
| 13 | BaMgAl$_{10}$O$_{17}$:Eu2+, Mn2+ | 515 | 0.14 | 0.65 | 39 | 88 |
| 14 | (Sr, Ba)SiO$_4$:Eu2+ | 517 | 0.23 | 0.61 | 54 | |
| 15 | SrAl$_2$O$_4$:Eu2+ | 523 | 0.29 | 0.58 | 28 | 77 |
| 16 | ZnS:Cu, Al | 534 | 0.31 | 0.61 | 29 | 83 |
| 17 | YBO$_3$:(Ce3+, Tb3+) (9.5%/5%) | 545 | 0.34 | 0.59 | 80 | 69 |
| 18 | Ca$_6$Mg(SiO$_4$)$_4$Cl$_2$:Eu2+, Mn2+ | 550 | 0.38 | 0.57 | 30 | 61 |
| 19 | Sr$_{1.95}$Ba$_{0.03}$Eu$_{0.02}$SiO$_4$ | 563 | 0.44 | 0.53 | 21 | |
| 20 | Sr$_2$P$_2$O$_7$:Eu2+, Mn2+ | 570 | 0.32 | 0.27 | 63 | 46 |
| 21 | ZnS:Cu, Mn | 585 | 0.49 | 0.45 | 19 | 44 |
| 22 | Gd$_2$MoO$_6$:Eu3+ (20%) | 610 | 0.66 | 0.34 | 50 | |
| 23 | Y$_2$W$_{0.98}$Mo$_{0.02}$O$_6$:Eu$^{3+}$ | 612 | 0.61 | 0.38 | 68 | 73 |
| 24 | Y$_2$WO$_6$:Eu3+, Bi3+ (7.5%, 0.5%) | 612 | 0.64 | 0.36 | 52 | |
| 25 | Lu$_2$WO$_6$:Eu3+, Bi3+ (7.5%, 1%) | 612 | 0.64 | 0.36 | 65 | |
| 26 | SrS:Eu2+ (2%) | 616 | 0.63 | 0.37 | 52 | 91 |
| 27 | La$_2$TeO$_6$:Eu3+ (%) | 617 | 0.66 | 0.34 | 76 | |
| 28 | (La, Y)$_2$O$_2$S:Eu3+ (. . .) | 626 | 0.67 | 0.33 | 84 | 73 |
| 29 | Sr$_2$Si$_5$N$_8$:Eu2+ (10%) | 636 | 0.64 | 0.36 | 12 | 70 |
| 30 | (Ba, Ca, Sr)MgSi$_2$O$_8$:Eu, Mn | 657 | 0.39 | 0.16 | 47 | 52 |

In the green region, the band of the phosphor No. 14 (Sr, Ba) SiO$_4$:EU$^{2+}$ is so broad that-in this case a separate red component can be dispensed with.

Finally, Table 6 shows 15 exemplary embodiments of specific combinations of phosphors from Table 4 in combination with a primary light source (UV-LED) with an emission peak in the range from 370 to 420 nm. The individual UV diodes are compiled in Table 5, in which the emission peak and the color locus (where defined, i.e. beyond 380 nm) of the individual diodes are given.

The information from Table 4 is also incorporated in columns 1 to 4 of Table 6, to facilitate comparison. Columns 5 to 10 record the suitability of the individual phosphors for excitation at various wavelengths, systematically for the short-wave diodes with an emission peak at 370 to 420 nm, in steps of 10 nm. The following 15 columns show specific examples (referred to as Ex 1 to Ex 15) of an RGB mixture, i.e. the combination of the short-wave LED (the second line gives the peak emission selected) with three phosphors from the red, green and blue-spectral regions. The number given in the respective column denotes the relative proportion of the spectral emission.

In the case of a strongly short-wave UV diode, below 380 nm, the UV diode does not provide any proportion of the secondary emission, partly on account of the considerable absorption by the three phosphors.

However, above a primary-emission of 380 nm the diode does contribute a small proportion, which rises as the wavelength increases, in the blue in addition to the blue phosphor. This proportion appears in Table 5 as an additional fourth contribution.

Figure 1:
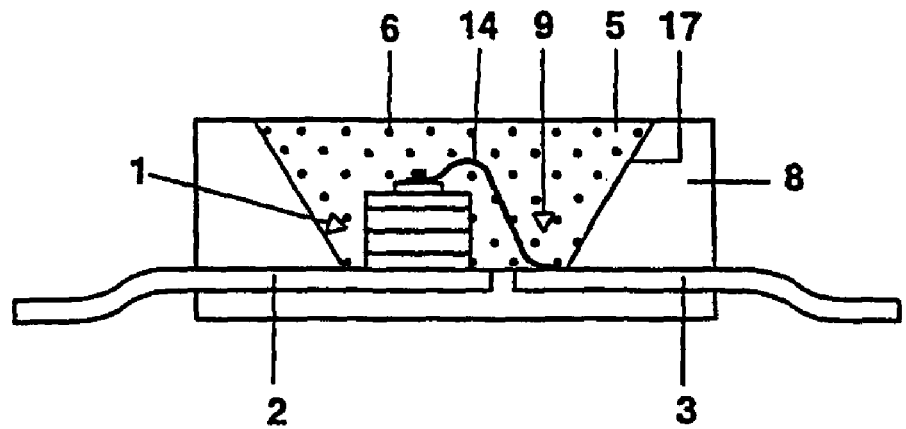
Figure 2:
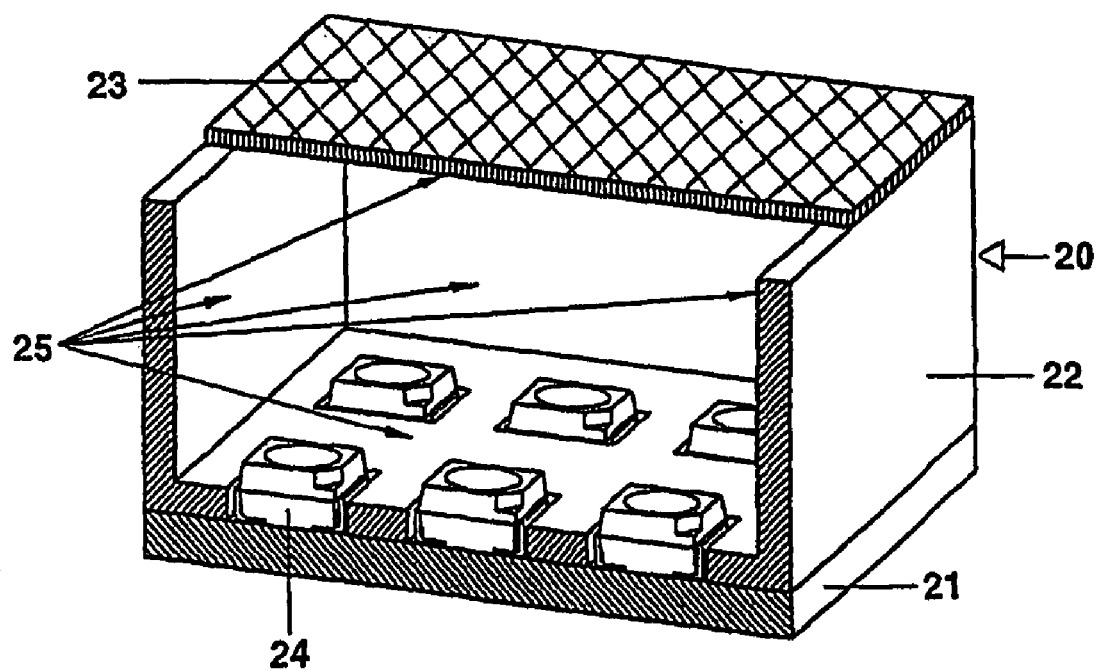
FIG. 2 shows part of a surface-lighting fitting 20 as illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting light-emitting diodes with a peak emission of 380 nm. The conversion into white light takes place by means of conversion layers which rest directly in the casting resin of the individual LED, as described in FIG. 1, or layers 25 which are arranged on all surfaces which are accessible to the UV radiation. These include the inner surfaces of the side walls of the housing, of the cover and of the base part. The conversion layers 25 consist of three phosphors which emit in the red, green and blue spectral regions using at least one of the phosphors according to the invention listed in Tables 1 to 3.
Figure 3:
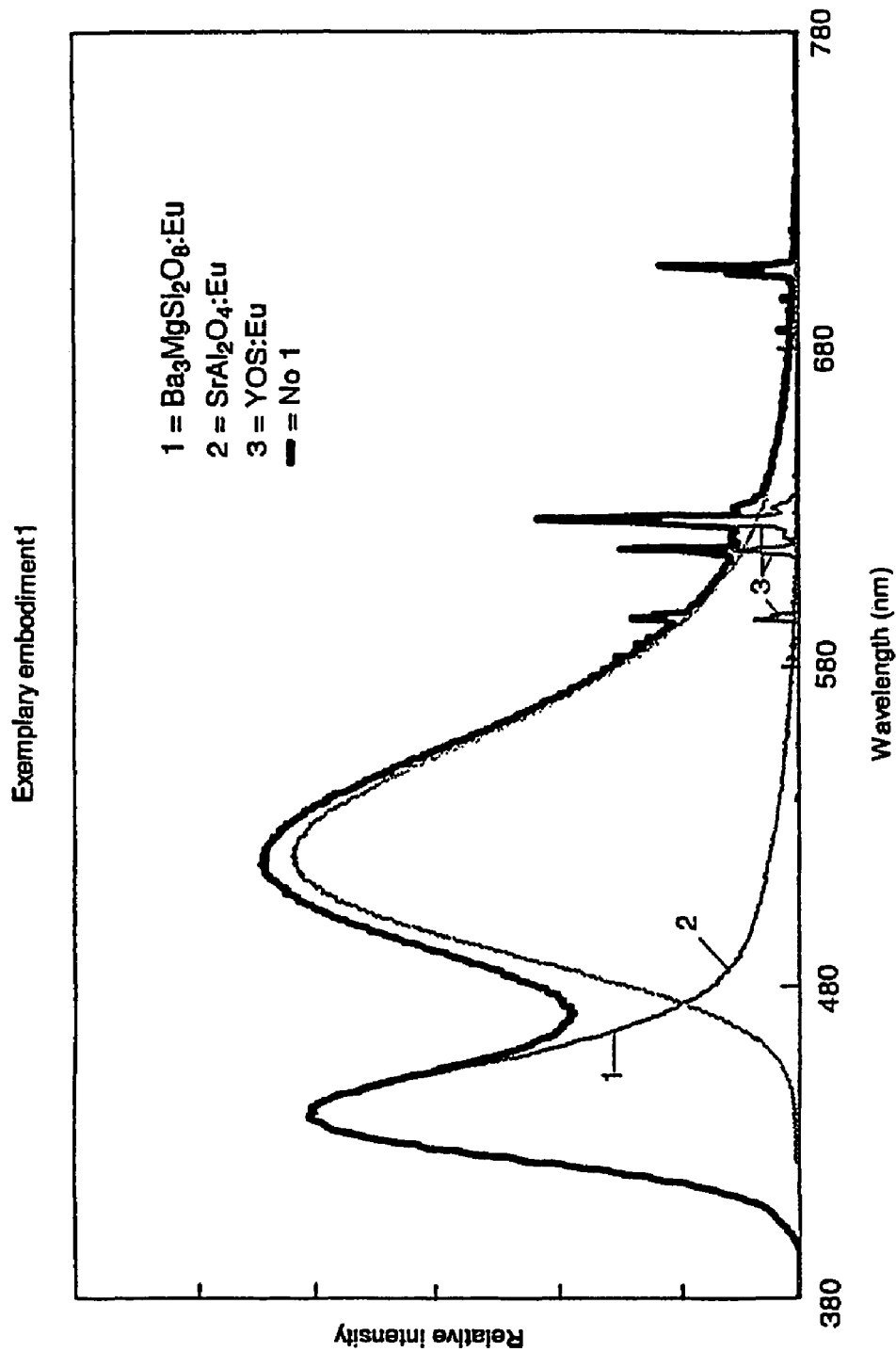
Figure 4:
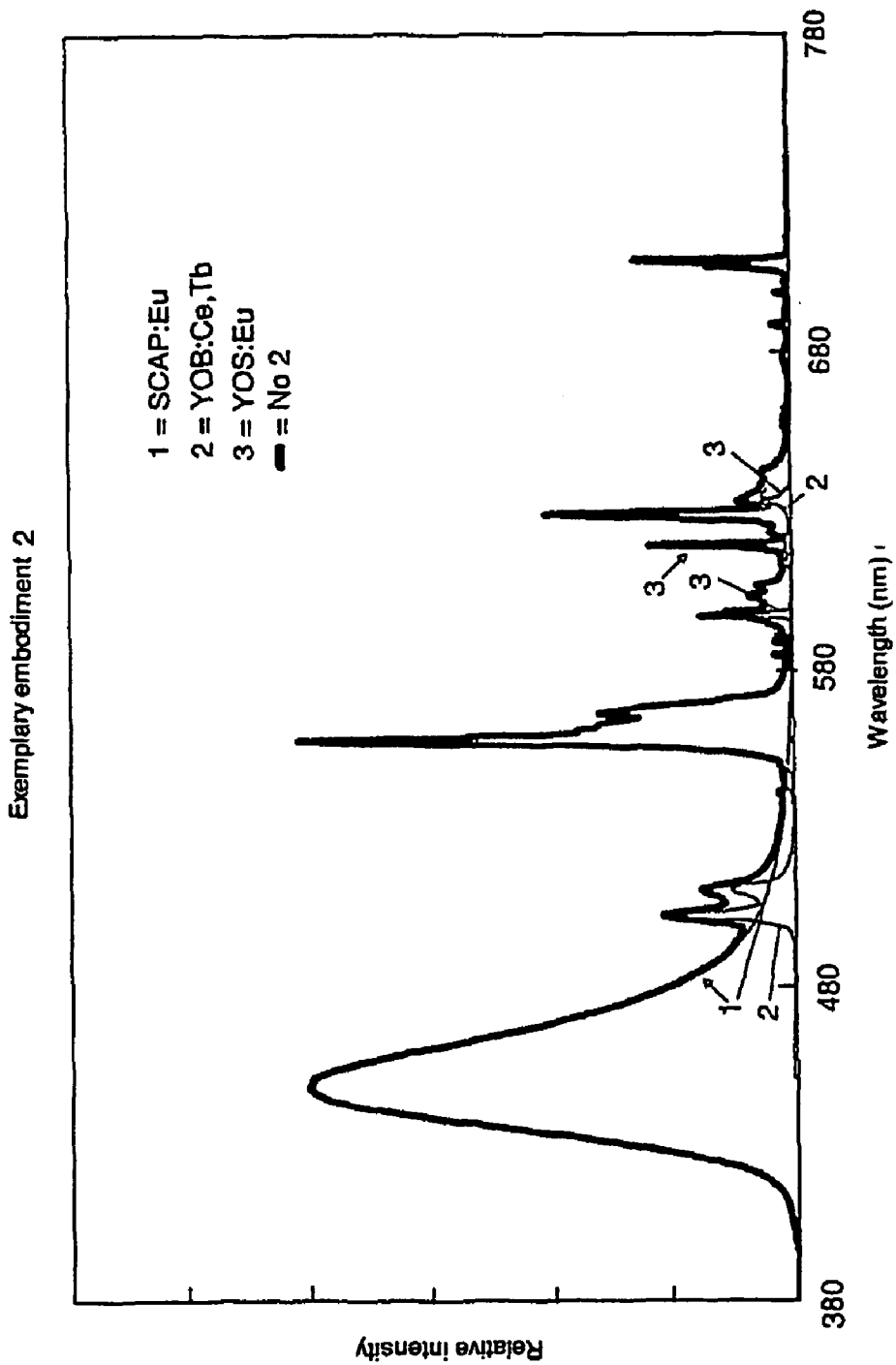
Figure 5:
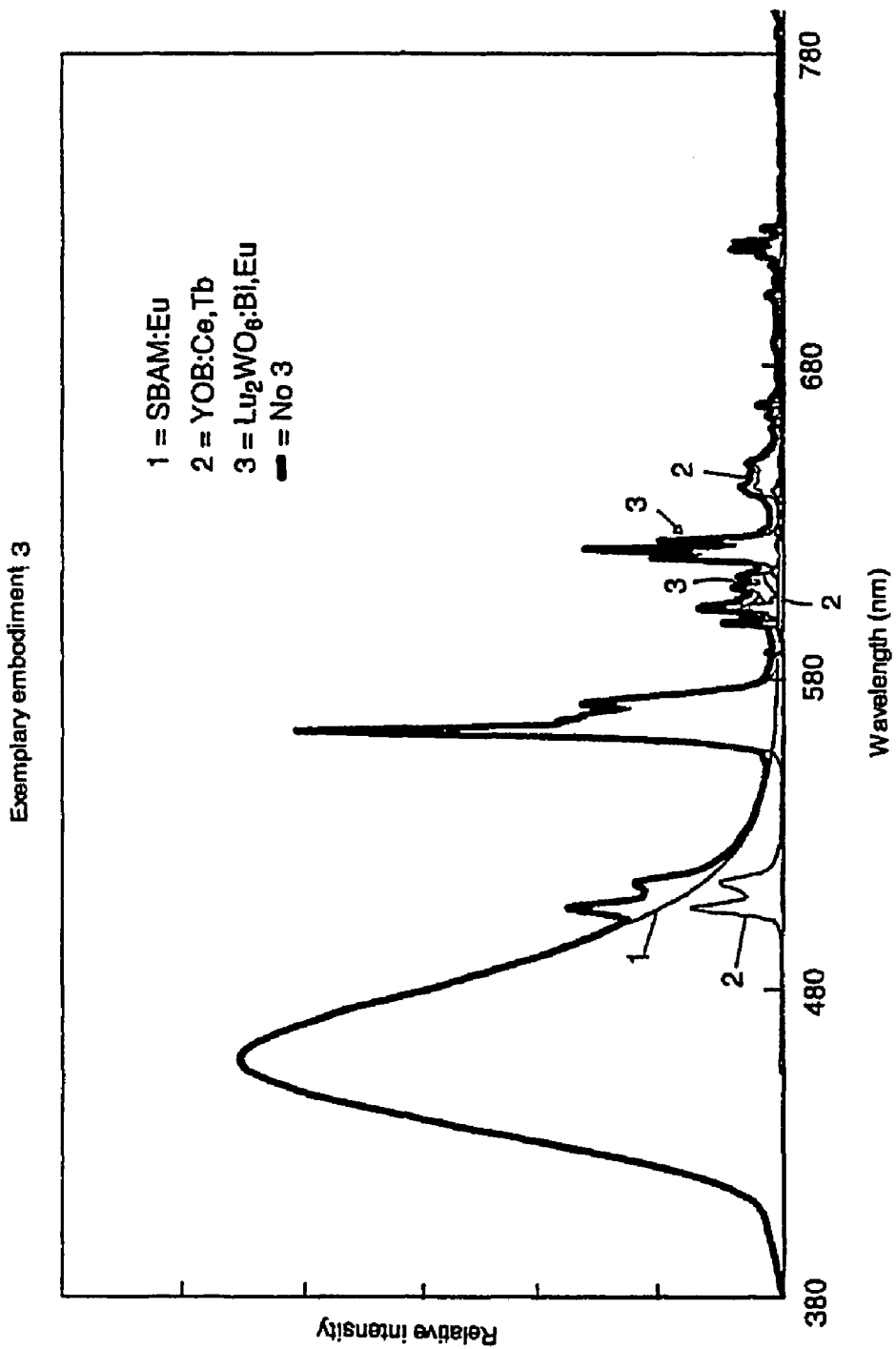

Finally, the last two lines of Table 6 show the measured color locus coordinates of the overall system, which cover a wide range of white tones in the chromaticity chart. The spectral distribution of this system is illustrated in FIG. 3 (corresponding to Ex 1) to 17 (corresponding to Ex 15).

The blue-emitting phosphors No. 2, 4 and 6, the green-emitting phosphors 8, 9, 10, 13, 15, 16, 17 and 18 and the red-emitting phosphors 26, 28 and 29 have proven to be particularly suitable phosphors for use in three-color mixtures under primary irradiation at 370 to 420 nm.

The exemplary embodiment No. 15 uses a blue-emitting diode with a peak emission at 420 nm and an intensity which is so high that it can completely replace the blue phosphor and only requires two additional phosphors in the green and red spectral regions.

TABLE 5

| No. | Em | x | y |
|---|---|---|---|
| UV1 | 370 | | |
| UV2 | 380 | 0.2 | 0.14 |
| UV3 | 390 | 0.19 | 0.09 |
| UV4 | 400 | 0.18 | 0.05 |
| UV5 | 410 | 0.18 | 0.03 |
| UV6 | 420 | 0.17 | 0.02 |

TABLE 5

| No. | Em | x | y | Ev. | 370 | 380 | 390 | 400 | ## | 420 | Ex1 | Ex2 | Ex3 | Ex4 | Ex5 | Ex6 |
|---|---|---|---|---|---|---|---|---|---|---|---|---|---|---|---|---|
| | 370 | | | | x | | | | | | 370 | 370 | 370 | 380 | 380 | 390 |
| | 380 | 0.2 | 0.14 | | | x | | | | | | | | 0.04 | 0.04 | 0.04 |
| 1 | 440 | 0.16 | 0.07 | 3 | x | | | | | 0.4 | | | | | | |

TABLE 5-continued

| No. | λ | x | y | n | Ex1 | Ex2 | Ex3 | Ex4 | Ex5 | Ex6 |
|---|---|---|---|---|---|---|---|---|---|---|
| 2 | 448 | 0.15 | 0.05 | 4 | x | x | x | x | x | x  0.4  0.38 |
| 3 | 452 | 0.14 | 0.07 | 1 | x |  |  |  | 0.4 | 0.28 |
| 4 | 454 | 0.15 | 0.08 | 4 | x | x | x | x | x | x  0.45 |
| 5 | 467 | 0.15 | 0.19 | 3 | x | x | x | x | x | x |
| 6 | 481 | 0.17 | 0.31 | 4 | x | x | x | x | x | x |
| 7 | 506 | 0.19 | 0.43 | 3 | x | x | x | x |  |  |
| 8 | 507 | 0.22 | 0.43 | 4 | x |  |  |  |  |  |
| 9 | 508 | 0.17 | 0.6 | 4 | x | x | x | x |  |  |
| 10 | 510 | 0.2 | 0.46 | 4 | x | x | x | x |  | 0.2 |
| 11 | 513 | 0.14 | 0.21 | 3 | x | x | x | x | x | x |
| 12 | 514 | 0.21 | 0.48 | 3 | x |  |  |  |  |  |
| 13 | 515 | 0.14 | 0.65 | 5 | x | x | x | x | x | x |
| 14 | 517 | 0.23 | 0.61 | 1 | x | x | x | x | x | x |
| 15 | 523 | 0.29 | 0.58 | 4 | x | x | x | x | x | x  0.42 |
| 16 | 534 | 0.31 | 0.61 | 5 | x | x | x | x |  | 0.35 |
| 17 | 545 | 0.34 | 0.59 | 1 | x |  |  |  | 0.4 | 0.4 |
| 18 | 550 | 0.38 | 0.57 | 4 | x | x | x | x |  |  |
| 19 | 563 | 0.44 | 0.53 | 2 | x | x | x | x | x  0.56 |  |
| 20 | 570 | 0.32 | 0.27 | 2 | x |  |  |  |  |  |
| 21 | 585 | 0.49 | 0.45 | 3 | x | x | x | x |  | 0.48 |
| 22 | 610 | 0.66 | 0.34 | 1 | x |  |  |  |  |  |
| 23 | 612 | 0.61 | 0.38 | 1 | x |  |  |  |  |  |
| 24 | 612 | 0.64 | 0.36 | 1 | x |  |  |  |  |  |
| 25 | 612 | 0.64 | 0.36 | 1 | x |  |  |  | 0.15 |  |
| 26 | 616 | 0.63 | 0.37 | 4 |  |  |  |  | x | x |
| 27 | 617 | 0.66 | 0.34 | 1 | x |  |  |  |  |  |
| 28 | 626 | 0.67 | 0.33 | 1 | x |  |  |  | 0.16 | 0.2 |
| 29 | 636 | 0.64 | 0.36 | 4 | x | x | x | x | x | x  0.25 |
| 30 | 657 | 0.39 | 0.16 | 2 | x | x | x | x |  |  |
| Overall color ordinate x |  |  |  |  | 0.31 | 0.331 | 0.299 | 0.331 | 0.308 | 0.322 |
| Overall color coordinate y |  |  |  |  | 0.33 | 0.322 | 0.325 | 0.328 | 0.33 | 0.332 |

| No. | Ex7 | Ex8 | Ex9 | Ex10 | Ex11 | Ex12 | Ex13 | Ex14 | Ex15 |
|---|---|---|---|---|---|---|---|---|---|
|  | 390 | 400 | 400 | 400 | 410 | 410 | 420 | 420 | 420 |
| 1 | 0.05 | 0.1 | 0.05 | 0.05 | 0.25 | 0.065 | 0.085 | 0.09 | 0.38 |
| 2 |  |  |  |  |  | 0.32 | 0.3 | 0.33 |  |
| 3 |  |  |  |  |  |  |  |  |  |
| 4 | 0.33 |  |  |  |  |  |  |  |  |
| 5 |  | 0.35 | 0.45 |  |  |  |  |  |  |
| 6 |  |  |  | 0.6 | 0.25 |  |  |  |  |
| 7 |  |  |  |  |  |  |  |  |  |
| 8 |  |  |  |  |  |  |  |  |  |
| 9 |  |  |  |  |  |  |  |  | 0.3 |
| 10 |  |  |  |  |  |  |  |  |  |
| 11 |  |  |  |  |  |  |  |  |  |
| 12 |  |  |  |  |  |  |  |  |  |
| 13 |  |  |  |  |  |  |  |  |  |
| 14 |  |  |  |  |  |  |  |  |  |
| 15 | 0.35 | 0.25 |  |  |  |  | 0.35 | 0.35 |  |
| 16 |  |  |  |  |  |  |  |  |  |
| 17 |  |  |  |  |  |  |  |  |  |
| 18 |  |  |  | 0.25 |  | 0.3 |  | 0.45 |  |
| 19 |  |  |  |  |  |  |  |  |  |
| 20 |  |  |  |  |  |  |  |  |  |
| 21 |  |  |  |  | 0.2 |  |  |  |  |
| 22 |  |  |  |  |  |  |  |  |  |
| 23 |  |  |  |  |  |  |  |  |  |
| 24 |  |  |  |  |  |  |  |  |  |
| 25 |  |  |  |  |  |  |  |  |  |
| 26 |  |  |  |  |  |  | 0.265 | 0.13 |  |
| 27 |  |  |  |  |  |  |  |  |  |
| 28 |  |  |  |  |  |  |  |  |  |
| 29 | 0.27 | 0.3 | 0.25 | 0.15 | 0.2 | 0.265 |  |  | 0.32 |
| 30 |  |  |  |  |  |  |  |  |  |
|  | 0.332 | 0.335 | 0.331 | 0.307 | 0.329 | 0.331 | 0.328 | 0.318 | 0.322 |
|  | 0.331 | 0.323 | 0.319 | 0.334 | 0.329 | 0.317 | 0.319 | 0.325 | 0.303 |

What is claimed is:

1. An illumination device with at least one LED as light source, the LED emitting primary radiation in the near UV or at blue short wavelength, this radiation being completely converted into radiation of a longer wave-length by at least one phosphor which is exposed to the primary radiation from the LED, wherein said at least one phosphor includes $(Sr,Ba)SiO_4 : Eu^{2+}$ which emits at a maximum wavelength of 517 nm.

2. The illumination device as claimed in claim 1 further comprising a second phosphor which is exposed to the primary radiation from the LED.

3. The illumination device of claim 2 wherein the second phosphor is the blue phosphor $m_5(PO_4)_3(X) : Eu^{2+}$ where M= at least one of the metals Ba, Ca alone or in combination with Sr, where X=F or a combination of F and Cl.

4. The illumination device of claim 2 wherein the second phosphor is the blue phosphor $M^{}MgAl_{10}O_{17} : Eu^{2+}$ where $M^{}$= at least one of the metals Eu, Sr alone or in combination with Ba.

5. An illumination device with at least one LED as the light source wherein the LED is a luminescence conversion LED which emits in the visible or white region, wherein the LED emits primarily in the near UV or blue at short wavelengths, characterized in that a phosphor $SrBaSiO_4 : Eu^{2+}$ emitting in a green region is used for secondary emission and a blue phosphor is additionally used in order to generate white light and optionally a red light component is used.

6. The illumination device as claimed in claim 5 wherein the LED emits primary radiation in the range from 370 to 430 nm of the optical spectral region (peak wavelength).

7. An illumination device with at least one LED as light source, the LED emitting primary radiation in the near UV or at blue short wavelength, this radiation being completely converted into radiation of a longer wave-length by exposure to at least a first and a second phosphor which is exposed to the primary radiation from the LED, wherein said first phosphor emitting in green region includes $(Sr, Ba) SiO_4 : Eu^{2+}$ and
the second phosphor is a blue phosphor: $M_5(PO_4)_3(X) : Eu^{2+}$ where M= at least one of the metals Ba, Ca alone or in combination with Sr, where X=F or a combination of F and Cl;
or a blue phosphor; $M^{}MgAl_{10}O_{17} : Eu^{2+}$ where $M^{}$=Sr alone or in combination with Ba.

8. The illumination device of claim 7 wherein the second phosphor is the blue phosphor $M_5(PO_4)_3(X) : Eu^{2+}$ where M= at least one of the metals Ba, Ca alone or in combination with Sr, where X=F or a combination of F and Cl.

9. The illumination device of claim 7 wherein the second phosphor is the blue phosphor $M^{}MgAl_{10}O_{17} : Eu^{2+}$ where $M^{}$= at least one of the metals Eu, Sr alone or in combination with Ba.

10. An illumination device with at least one LED as light source, the LED emitting primary radiation in the near UV or at blue short wavelength, this radiation being completely converted into radiation of a longer wave-length by at least one phosphor which is exposed to the primary radiation from the LED, wherein said at least one phosphor emitting in green region includes $SrBaSiO_4 : Eu^{2+}$.

\* \* \* \* \*